United States Patent [19]

Heinzelmann

[11] Patent Number: 5,055,798
[45] Date of Patent: Oct. 8, 1991

[54] HYBRID MATRIX AMPLIFIER SYSTEMS, AND METHODS FOR MAKING THERMALLY-BALANCED HYBRID MATRIX AMPLIFIER SYSTEMS

[75] Inventor: Christine Heinzelmann, El Segundo, Calif.

[73] Assignee: Hughes Aircraft Company, Los Angeles, Calif.

[21] Appl. No.: 594,472

[22] Filed: Oct. 9, 1990

[51] Int. Cl.$^5$ .............................................. H03F 3/68
[52] U.S. Cl. ..................................... 330/295; 330/286
[58] Field of Search ...................... 330/53, 124 R, 286, 330/295; 333/109, 113, 114, 115, 116, 117

[56] References Cited

U.S. PATENT DOCUMENTS

| | | | |
|---|---|---|---|
| 4,016,503 | 4/1977 | Rambo | 333/109 X |
| 4,825,172 | 4/1989 | Thompson | 330/295 X |

Primary Examiner—Steven Mottola
Attorney, Agent, or Firm—Robert A. Westerlund; Steven M. Mitchell; Wanda K. Denson-Low

[57] ABSTRACT

A hybrid matrix amplifier system that yields balanced thermal loads with minimal input signal constraints includes an input multiport hybrid coupler system having outputs joined to a plurality of amplifiers, and an output multiport hybrid coupler system joined to the outputs of the amplifiers. The input multiport hybrid coupler system, and the output multiport hybrid coupler system, each include n stages where n is an integer equal to or greater than 1, with each stage including $2^{n-1}$ couplers. These coupler systems may also include strategically-placed phase shifters. Such systems also include N amplifiers where N is equal to $2^n$, with N inputs from the outputs of the input multiport hybrid coupler system, and with the outputs of the amplifiers connected as inputs to the output multiport hybrid coupler system. This configuration permits a division of the N amplifiers into two groups that each dissipates substantially the same quantity of heat energy.

21 Claims, 3 Drawing Sheets

HYBRID MATRIX AMPLIFIER SYSTEMS, AND METHODS FOR MAKING THERMALLY-BALANCED HYBRID MATRIX AMPLIFIER SYSTEMS

BACKGROUND OF THE INVENTION

1. Field of the Invention

This invention relates to amplifier hybrid matrices, especially such matrices used with a multiple beam antenna, and to methods for balancing, and equally distributing the thermal load from such systems.

2. Description of the Prior Art

Until now, amplifier hybrid matrices have been physically arrayed, as in three-axis spacecraft, by dividing them, matrix-by-matrix, between the radiator panels in such devices. Such arrays impose design constraints on the multiple beam antennas used with such spacecraft, and often produce unbalanced thermal loads between or among the radiator panels in such craft, even where such matrices are evenly distributed between or among the radiator panels in such spacecraft.

SUMMARY OF THE INVENTION

This invention relates to hybrid matrix amplifier systems that yield balanced thermal loads with no constraint on the number of amplifier hybrid matrices and minimal input signal or multiple beam antenna constraints. Such a thermally-balanced hybrid matrix amplifier system includes an input multiport hybrid coupler system including $n \times 2^{n-1}$ hybrid couplers, where n is an integer equal to or greater than 1, divided into n stages. Each of these stages includes $2^{n-1}$ hybrid couplers. The input multiport hybrid coupler system has N input terminals, where N is equal to $2^n$, and N output terminals. Connected to the N output terminals of the input multiport hybrid coupler system are N amplifiers. Connected to the outputs of the N amplifiers is an output multiport hybrid coupler system. This output system includes N input terminals connected to the outputs of the N amplifiers. The output multiport hybrid coupler system also includes $n \times 2^{n-1}$ hybrid couplers divided into n stages where n is an integer equal to or greater than 1 with each stage including $2^{n-1}$ hybrid couplers. The output multiport hybrid coupler system is identical in layout to the input multiport hybrid coupler system. However, its input and output terminals are reversed from those of the input multiport hybrid coupler system, and its input terminals are connected to the N amplifiers in an order reversed from that of the output terminals of the input multiport hybrid coupler system.

In some embodiments, these systems also include strategically-placed phase shifters. The phase shifters are used to vary the relative phases of the signals appearing at the amplifier inputs and, thus, to change the net signal characteristics seen by the amplifiers.

In preferred embodiments, the N amplifiers are divided into two groups, with each group including half of the amplifiers. Each of these groups dissipates substantially the same thermal energy during operation of the amplifier hybrid matrix system, regardless of the relative power of input signals. In some embodiments, each of these amplifier groups is positioned adjacent to radiator panels to dissipate the thermal energy that the amplifiers emit during operation. Such radiator panels are affixed on the walls of a three-axis spacecraft that receives signals from a multiple beam antenna. Such panels are preferably of substantially the same size and have substantially the same capacity to dissipate thermal energy. In addition, the radiator panels are preferably sized closely to the average thermal requirements at full signal loading. Formerly, such panels were oversized to accommodate power dissipation swings resulting from thermal loading imbalance between amplifier groups.

Embodiments of these systems that are adapted to present any one signal to the input multiport hybrid system at more than one input terminal include means for placing the signal at the same phase at each of these terminals.

BRIEF DESCRIPTION OF THE DRAWINGS

The apparatus and methods of this invention can better be understood by reference to the accompanying drawings, in which.

DETAILED DESCRIPTION OF THE PREFERRED EMBODIMENTS

Figure 1:
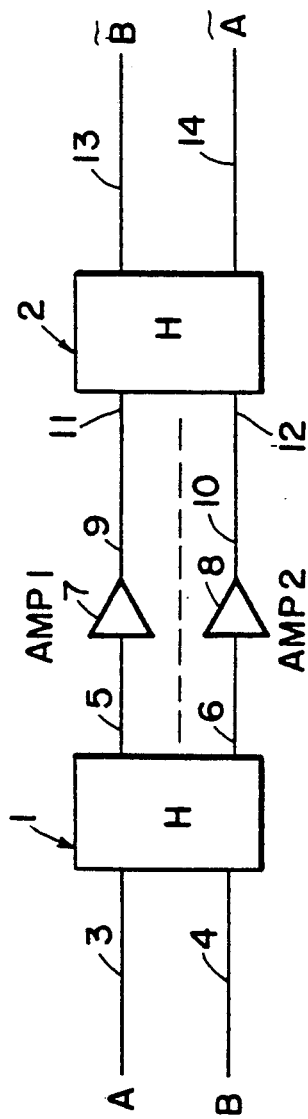
FIG. 1 is a schematic diagram of a preferred embodiment of the hybrid matrix amplifier system of this invention containing one input stage, one output stage and two amplifiers.

FIG. 1 shows an amplifier hybrid matrix system of this invention including one input stage containing hybrid coupler 1, and an output hybrid coupler 2. Input hybrid coupler 1 includes two inputs 3 and 4 and two outputs 5 and 6. Outputs 5 and 6 form inputs to amplifiers 7 and 8 respectively. Output 9 from amplifier 7 and output 10 from amplifier 8 are connected as inputs 11 and 12 to coupler 2. The output ports 13 and 14 on output hybrid coupler 2 carry amplifications of input signals presented to input terminals 3 and 4, but in reverse order. Thus, the input signal on path 4 appears on output path 13; the input signal on path 3, on output path 14. With this configuration, amplifier 7 dissipates substantially the same amount of heat energy as amplifier 8.

Figure 2:
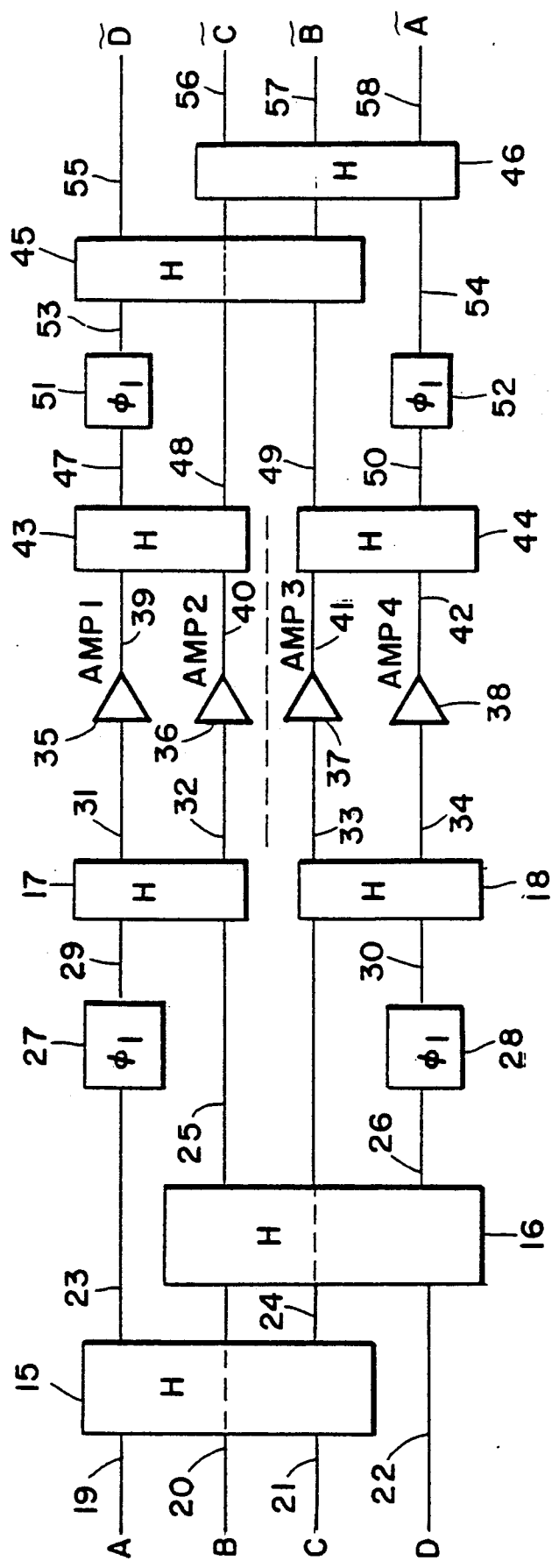
FIG. 2 is a schematic diagram of a preferred embodiment of the hybrid matrix amplifier system of this invention including two input stages, two output stages, and four amplifiers.

FIG. 2 shows an amplifier hybrid matrix system including two input stages. The first of these input stages includes hybrid couplers 15 and 16 in the first stage, and hybrid couplers 17 and 18 in the second stage. Hybrid coupler 15 has two input ports 19 and 21. Hybrid coupler 16 has two input ports 20 and 22. Coupler 15 also has two output ports 23 and 24. Coupler 16 has two output ports 25 and 26. Output port 23 is connected to phase shifter 27; output port 26, to phase shifter 28. Phase shifter 27 is connected to coupler 17 via path 29. Phase shifter 28 is connected to coupler 18 via path 30. Signals from output port 25 of coupler 16 pass to coupler 17. Signals from output port 24 pass to coupler 18.

Signals from couplers 17 and 18 pass on paths 31, 32, 33 and 34 to amplifiers 35, 36, 37 and 38 respectively. Outputs from amplifiers 35-38 pass on paths 39, 40, 41 and 42 as inputs to output hybrid couplers 43 and 44. Signals on paths 47 and 50 form inputs to phase shifters 51 and 52 with outputs 53 and 54, respectively. Signals on paths 53 and 49 form inputs to coupler 45, and signals on paths 48 and 54 form inputs to coupler 46. Outputs from couplers 45 and 46 appear at output ports 55, 56, 57 and 58.

The amplifier hybrid matrix system of FIG. 2 includes an input multiport hybrid coupler with n stages where n is an integer equal to or greater than 1, namely 2, with each stage including $2^{n-1}$ couplers (i.e. $2^1$) or four couplers in all, namely couplers 15, 16, 17 and 18. The output multiport hybrid coupler array in FIG. 2 also includes n stages, here where n is 2, that include a total of $n \times 2^{n-1}$ (i.e. $2 \times 2^1$) or four couplers, namely couplers 43, 44, 45 and 46. The input multiport hybrid coupler system is joined to N amplifiers where N equals $2^n$, i.e. $2^2$ or 4. These N amplifiers are connected to N (i.e. 4) input terminals of the output multiport hybrid system. Amplifications of the signals presented to the input terminals of the input multiport hybrid coupler system appear at the output terminals of the output multiport hybrid system, but in reverse order. When the necessary input signal conditions are met, the total heat dissipated by amplifiers 35 and 36 is substantially equal to the total heat dissipated in amplifiers 37 and 38. These amplifiers can be formed into two groups, each containing the same number of amplifiers. Here, one group includes amplifiers 35 and 36; the other group, amplifiers 37 and 38. Each group then produces substantially equal average power output, and substantially the same thermal load.

That each group produces substantially equal average power output, and substantially the same thermal load, can be demonstrated mathematically. Thus, in FIG. 2, the symbols A, B, C, and D represent arbitrary amplitude weightings of coherent input signals. If $X_{35}$, $X_{36}$, $X_{37}$ and $X_{38}$ are complex amplitudes of the signals at the amplifier inputs 35, 36, 37 and 38, then $X_{35}$, $X_{36}$, $X_{37}$ and $X_{38}$ can be expressed mathematically as follows:

$$X_{35} = \tfrac{1}{2}[Ae^{j\phi_1} - jB - jCe^{j\phi_1} D]$$

$$X_{36} = \tfrac{1}{2}[-jAe^{j\phi_1} + B - Ce^{j\phi_1} - jD]$$

$$X_{37} = \tfrac{1}{2}[-jA - Be^{j\phi_1} + C - jDe^{j\phi_1}]$$

$$X_{38} = \tfrac{1}{2}[-A - jBe^{j\phi_1} - jC + De^{j\phi_1}]$$

Thus, the power at each amplifier input can be expressed as follows:

Power (Amp 35) = $|X_{35}|^2 = \tfrac{1}{4}[A^2 + B^2 + C^2 + D^2] +$
$\tfrac{1}{4}[-AB\sin(\phi_1) - AD\cos(\phi_1) + BC\cos(\phi_1) - CD\sin(\phi_1)]$ Power (Amp 36) = $|X_{36}|^2 = \tfrac{1}{4}[A^2 + B^2 + C^2 + D^2] +$
$\tfrac{1}{4}[AB\sin(\phi_1) + AD\cos(\phi_1) - BC\cos(\phi_1) + CD\sin(\phi_1)]$ Power (Amp 37) = $|X_{37}|^2 = \tfrac{1}{4}[A^2 + B^2 + C^2 + D^2] +$
$\tfrac{1}{4}[AB\sin(\phi_1) + AD\cos(\phi_1) - BC\cos(\phi_1) + CD\sin(\phi_1)]$ Power (Amp 38) = $|X_{38}|^2 = \tfrac{1}{4}[A^2 + B^2 + C^2 + D^2] +$
$\tfrac{1}{4}[-AB\sin(\phi_1) - AD\cos(\phi_1) + BC\cos(\phi_1) - CD\sin(\phi_1)]$ As these formulas show, for any arbitrary phase shift $\phi_1$ the power at amplifier input 35 is substantially the same as the power at amplifier input 38, and the power at amplifier input 36 is substantially the same as the power at amplifier input 37. Where amplifiers 35-38 are of substantially the same size and design, the output power and thermal dissipation from these two amplifier groups is also substantially the same.

Figure 3:
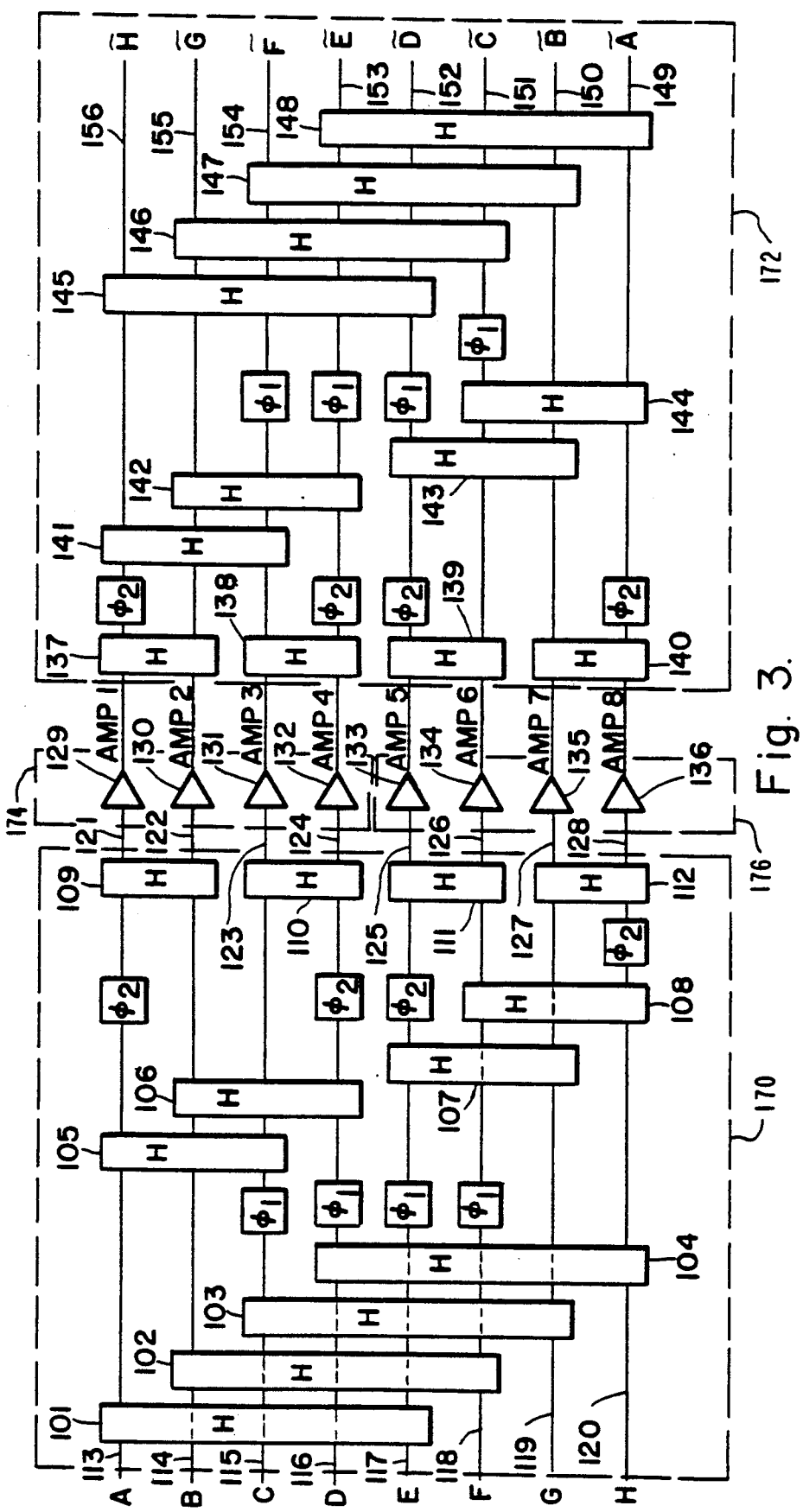
FIG. 3 is a schematic diagram of a preferred embodiment of the hybrid matrix amplifier system of this invention including three input stages and three output stages, with each of the three input stages including four hybrid couplers, and each of the three output stages including four hybrid couplers, and eight amplifiers.
Figure 4:
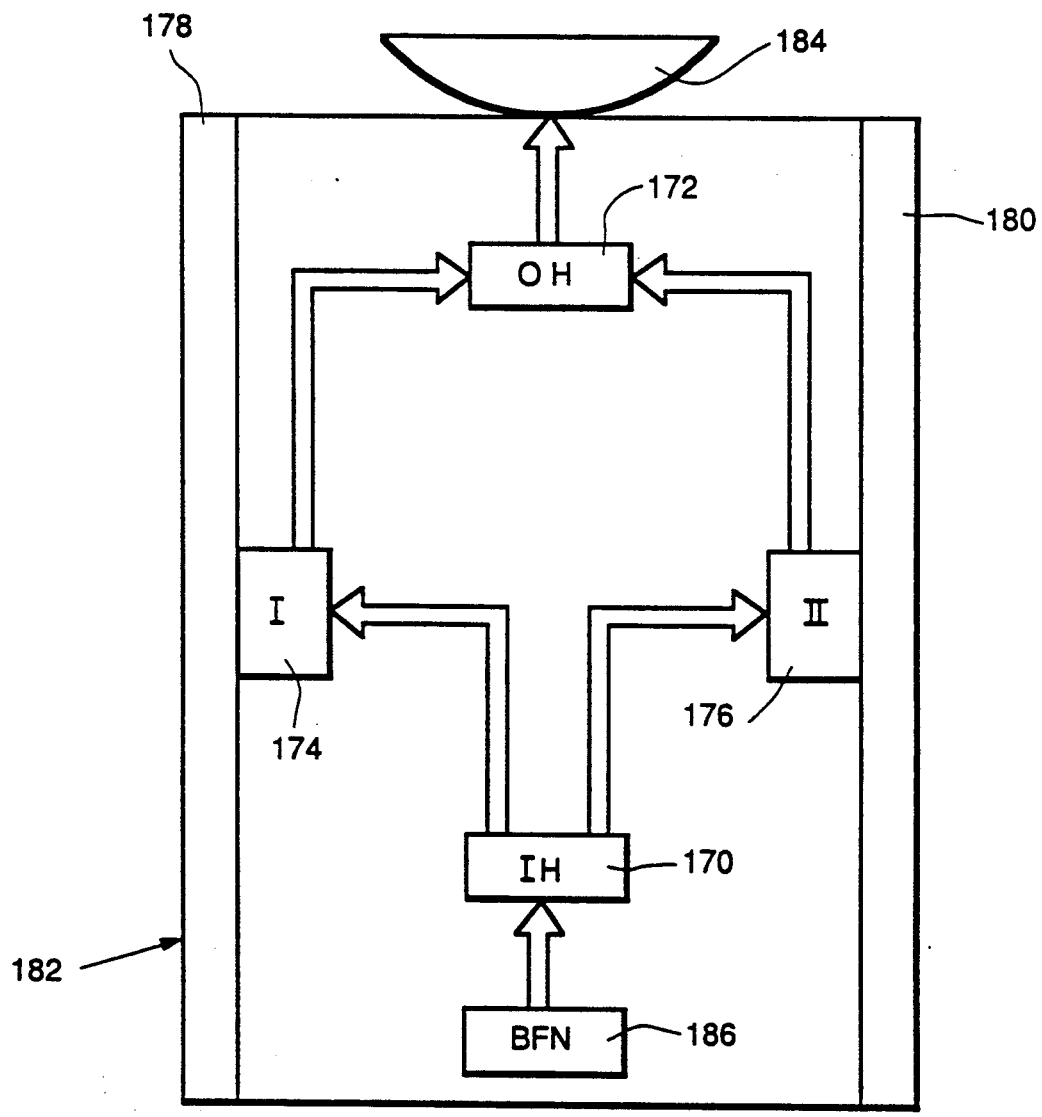
FIG. 4 is a diagrammatical plan view of a satellite/spacecraft incorporating the embodiment of the hybrid matrix amplifier system of the present invention depicted in FIG. 3.

FIG. 3 is a third embodiment of the amplifier hybrid matrix system of this invention. In FIG. 3, the input multiport hybrid coupler system (H) 170 includes three input stages (i.e. n is 3). The first input stage includes couplers 101, 102, 103 and 104. The second input stage includes couplers 105, 106, 107 and 108. The third input stages includes couplers 109, 110, 111 and 112. Thus, the input system includes n (i.e. 3) stages, with each stage including $2^{n-1}$ couplers (i.e. $2^{3-1}$), or 4 couplers. The $N=2^n$ or eight input signals to this system are fed to input terminals 113, 114, 115, 116, 117, 118, 119 and 120. The nth (i.e. 3rd) stage formed by couplers 109-112, includes N outputs 121, 122, 123, 124, 125, 126, 127 and 128. These N outputs form N inputs to N (i.e. 8) amplifiers 129, 130, 131, 132, 133, 134, 135, and 136.

The N (i.e. 8) outputs of these amplifiers 129-136 are connected to N input terminals of the output multiport hybrid coupler system. This output system (OH) 172 also has three stages. The output multiport hybrid coupler system 172, in its first stage, includes couplers 137, 138, 139 and 140. The second stage includes couplers 141, 142, 143 and 144. The third output stage includes couplers 145, 146, 147 and 148. The output multiport hybrid coupler system 172 also has N (i.e. 8) outputs appearing on paths 149, 150, 151, 152, 153, 154, 155 and 156. These eight outputs are amplifications of the signals presented to the eight input terminals, but are in reverse order. Since this hybrid amplifier matrix system of FIG. 3 meets the symmetry requirements of this invention, with input signals meeting the input phasing requirement, amplifiers 129-132 produce total average output power and generate thermal loads approximately equal to those produced by amplifiers 133-136. This property permits forming the amplifiers into two groups 1 and 11 (174 and 176) of four each, and attaching each of these groups 1 and 11 (174 and 176) to a separate heat dissipation panel 178, 180, respectively, of a satellite/spacecraft 182, which also includes a reflector antenna 184 coupled to the output multiport hybrid coupler system 172 for transmission of amplified versions of the antenna beam signals produced by a beam forming network 186 coupled to the input multiport hybrid coupler system 170. Each panel 178, 180 is then exposed to substantially the same thermal load.

What is claimed is:

1. A hybrid matrix amplifier system for processing N input signals, including an input multiport hybrid coupler system comprising $N \times 2^{n-1}$ hybrid couplers divided into n stages where n is an integer equal to or greater than 2 and where each stage includes $2^{n-1}$ hybrid couplers; said input multiport coupler system having N input terminals for receiving the N input signals and N output terminals where N is equal to $2^n$, said N output terminals being connected to N amplifiers, said N amplifiers having outputs connected to an output multiport hybrid system including n stages, each stage including $2^{n-1}$ hybrid couplers, wherein the N input signals may be of arbitrary amplitude.

2. The system of claim 1 wherein said N amplifiers are divided into groups, with each group including the same number of amplifiers, and each group dissipating substantially the same thermal energy.

3. The system of claim 2 wherein each of the amplifier groups is positioned adjacent to a separate radiator panel to dissipate, through each panel, substantially the sam thermal energy.

4. The system of claim 3 wherein each of said radiator panels is positioned on the walls of a three-axis spacecraft that receives signals from a multiple beam antenna.

5. The system of claim 4 wherein each of said radiator panels is of substantially the same size and has substantially the same capacity to dissipate thermal energy.

6. The system of claim 1 wherein said N input terminals of said input multiport hybrid coupler system are coupled to outputs of corresponding N signal transmission lines of a feed network of an antenna means.

7. The system of claim 6 wherein said output multiport hybrid coupler system includes N output terminals coupled to corresponding N input ports of said antenna means.

8. The system of claim 6 wherein at least two of said N signal transmission lines of said antenna feed network convey beam-forming RF signals of unequal amplitude.

9. The system of claim 8 further comprising at least one phase shifter in said input coupler system and at least one phase shifter in said output coupler system.

10. The system of claim 1 further comprising at least one phase shifter in said input coupler system and at least one phase shifter in said output coupler system.

11. The system of claim 6 wherein said antenna means is carried by a spacecraft.

12. The system of claim 1 wherein said N amplifiers are each of substantially the same design.

13. The system of claim 3 wherein said amplifiers are of substantially the same size and of substantially the same design.

14. A system comprising N signal transmission lines of a beam-forming network of an antenna means, said N signal transmission lines having N outputs coupled to N input terminals of an input multiport hybrid coupler system adapted to receive N input signals, said input multiport hybrid coupler system comprising $n \times 2^{n-1}$ hybrid couplers divided into n stages where n is an integer equal to or greater than 2 and where each stage includes $2^{n-1}$ hybrid couplers; said input multiport coupler system having N output terminals where N is equal to $2^n$, said N output terminals being connected to N amplifiers, said N amplifiers having outputs connected to an output multiport hybrid system including n stages, each stage including $2^{n-1}$ hybrid couplers, wherein the N input signals may be of arbitrary amplitude.

15. The system of claim 14 wherein said output multiport hybrid coupler system further includes N output terminals coupled to corresponding N input ports of said antenna means.

16. The system of claim 14 wherein at least of two of said N signal transmission lines of said antenna feed network convey beam-forming RF signals of unequal amplitude.

17. The system of claim 16 further comprising at least one phase shifter in said input coupler system and at least one phase shifter in said output coupler system.

18. The system of claim 14 further comprising at least one phase shifter in said input coupler system and at least one phase shifter in said output coupler system.

19. The system of claim 14 wherein said antenna means is carried by a spacecraft.

20. The system of claim 14 wherein said N amplifiers are of substantially the same size and design.

21. The system of claim 14 wherein said N amplifiers are divided into two groups, each of said groups including the same number of amplifiers, and each of said groups dissipating substantially the same thermal energy.

* * * * *